United States Patent [19]

Garnier et al.

[11] Patent Number: 5,347,144
[45] Date of Patent: Sep. 13, 1994

[54] THIN-LAYER FIELD-EFFECT TRANSISTORS WITH MIS STRUCTURE WHOSE INSULATOR AND SEMICONDUCTOR ARE MADE OF ORGANIC MATERIALS

[75] Inventors: Francis Garnier, Champigny; Gilles Horowitz, Villebon sur Yvette; Denis Fichou, Paris, all of France

[73] Assignee: Centre National de la Recherche Scientifique (CNRS), Paris, France

[21] Appl. No.: 966,048

[22] PCT Filed: Jul. 4, 1991

[86] PCT No.: PCT/FR91/00541

§ 371 Date: Jan. 3, 1993

§ 102(e) Date: Jan. 3, 1993

[87] PCT Pub. No.: WO92/01313

PCT Pub. Date: Jan. 23, 1992

[30] Foreign Application Priority Data

Jul. 4, 1990 [FR] France ............... 90 08488

[51] Int. Cl.$^5$ .................................. H01L 29/28
[52] U.S. Cl. ............................ 257/40; 257/289; 257/410; 257/642
[58] Field of Search ............... 257/40, 289, 410, 347, 257/642

[56] References Cited

U.S. PATENT DOCUMENTS 4,332,524  3/1982  Onda et al. .................. 536/55
4,987,430  1/1991  Clarisse et al. ............. 257/40

FOREIGN PATENT DOCUMENTS 0080329  6/1983  European Pat. Off. .
0182548  5/1986  European Pat. Off. .
0298628  1/1989  European Pat. Off. .
2583222  12/1986  France .
58-98909  6/1983  Japan .
63-280457  11/1988  Japan .
1-146365  6/1989  Japan ..................... 257/40
3-50775  3/1991  Japan ..................... 257/40

OTHER PUBLICATIONS

G. Horowitz et al, "A Field-Effect Transistor Based on Conjugated Alpha-Sexithienyl", *Solid State Communications*, vol. 72, No. 4, 1989, pp. 381–384.

X. Peng et al, "All-Organic Thin-Film Transistors Made of Alpha-Sexithienyl Semiconducting and Various Polymeric Insulating Layers", *Applied Physics Letters*, vol. 57, No.19, Nov. 5, 1990, pp. 2013–2015.

*Primary Examiner*—Sara W. Crane
*Attorney, Agent, or Firm*—Oliff & Berridge

[57] ABSTRACT

A thin-layer field-effect transistor (TFT) with an MIS structure includes a thin semiconductor layer between a source and a drain. The thin semiconductor layer is in contact with one surface of a thin layer made of insulating material, and in contact by its other surface with a conducting grid. The semiconductor is composed of at least one polyconjugated organic compound with a specific molecular weight. The polyconjugated organic compound or polyconjugated organic compounds contain at least 8 conjugated bonds and have a molecular weight of no greater than approximately 2,000. The thin layer of insulating material is made of an insulating organic polymer having a dielectric constant of at least equal to 5. The transistor is useful as a switching or amplifying element.

14 Claims, 1 Drawing Sheet

5,347,144

THIN-LAYER FIELD-EFFECT TRANSISTORS WITH MIS STRUCTURE WHOSE INSULATOR AND SEMICONDUCTOR ARE MADE OF ORGANIC MATERIALS

TECHNICAL FIELD

The present invention relates to a thin film field-effect transistor (TFT) in which the materials of which the semiconductor and insulator are made are both organic materials.

BACKGROUND

It is known that field-effect transistors with an MIS (metal/insulator/semiconductor) structure have a metal electrode called a grid applied to one surface of a layer of insulating material whose other surface is covered with a layer of semiconductor material disposed between a current input and an output electrode called the source and drain, respectively. Application of a potential to the grid creates an electrical field that causes charges to appear in the semiconductor in the vicinity of the insulating layer. Thus, in the semiconductor zone located between the source and the drain, a bridge is created which can be made conducting and which is generally called a "channel." When the grid is energized and the channel becomes conducting, the transistor is called an "enrichment type," because its principal current increases when a potential is applied to the grid. In other systems, the channel conducts in the absence of voltage applied to the grid, and it is application of a potential to the grid that blocks the channel current. This is then called an "impoverishment type" transistor.

Classical MIS structure field-effect transistors, commonly called MISFET, are generally made on a silicon substrate strongly doped to make it conduct. A metal layer is deposited on one surface of the substrate so that the grid voltage can be applied. An insulating silica layer is made to grow on the other surface of the substrate. To this silica layer a semiconducting layer and the two metal contacts constituting the source and drain are applied. The source and drain may be in contact with the insulating layer or disposed above the semiconductor layer.

It has recently been proposed that thin-layer field-effect transistors be made in which the semiconductor is a thin layer of an organic polymer such as polyacetylene; see for example European Patent Application 0,298,628. In the transistors of this European patent application, the insulating layer is made with classical mineral insulators (silica, silicon nitride) but it is also planned to use polymers with good insulating properties for this purpose, without however any specific examples of such an insulator and such an embodiment being given.

It is also known that replacement of semiconductor organic polymers by oligomers with a given molecular weight improves the mobility of the charge carriers. Thus, a TFT type thin-layer transistor has recently been described in which the semiconductor is alpha-sexithienyl deposited on an insulator constituted by silica. Such a transistor, under the field effect, has evidenced distinctly improved carrier mobility relative to the mobility observed with a comparable device whose semiconductor is a polymer: polymethylthiophene. Indeed, in the case of alpha-sexithienyl, the mobility of the carriers under the field effect reaches $0.84 \times 10^{-3} cm^{-2} \cdot V^{-1} \cdot s^{-1}$. This value is 10 to 100 times that obtained with comparable transistors using organic polymers such as poly(3-methylthiophene) and polyacetylene as semiconductors; see for example G. Horowitz, et al., Solid State Communications, Vol. 72 No. 4, pp. 381–384 (1989).

SUMMARY OF THE INVENTION

It has now been discovered that it is possible to improve the mobility of the carriers under the field effect still further with a TFT transistor that combines a polyconjugated organic semiconductor having a specific molecular weight (unlike polymers) and an appropriately chosen insulating organic polymer. In this way, the invention allows the properties of thin-layer field-effect transistors to be improved. Moreover, because of the production of a "totally organic" system, it is possible to make such transistors on substrates of any shape, including flexible substrates made of polymer materials.

Hence an object of the present invention is a thin-layer field-effect transistor (TFT) with an MIS structure comprising a thin semiconductor layer between a source and a drain, said thin semiconductor layer being in contact with one surface of a thin layer made of insulating material, and said thin insulating layer being in contact by its other surface with a conducting grid. The semiconductor is composed of at least one polyconjugated organic compound with a specific molecular weight. The polyconjugated organic compound or polyconjugated organic compounds contain at least 8 conjugated bonds and have a molecular weight of no greater than approximately 2,000. The thin layer of insulating material is made of an insulating organic polymer having a dielectric constant of at least 5.

DETAILED DESCRIPTION OF PREFERRED EMBODIMENTS

Figure 1:
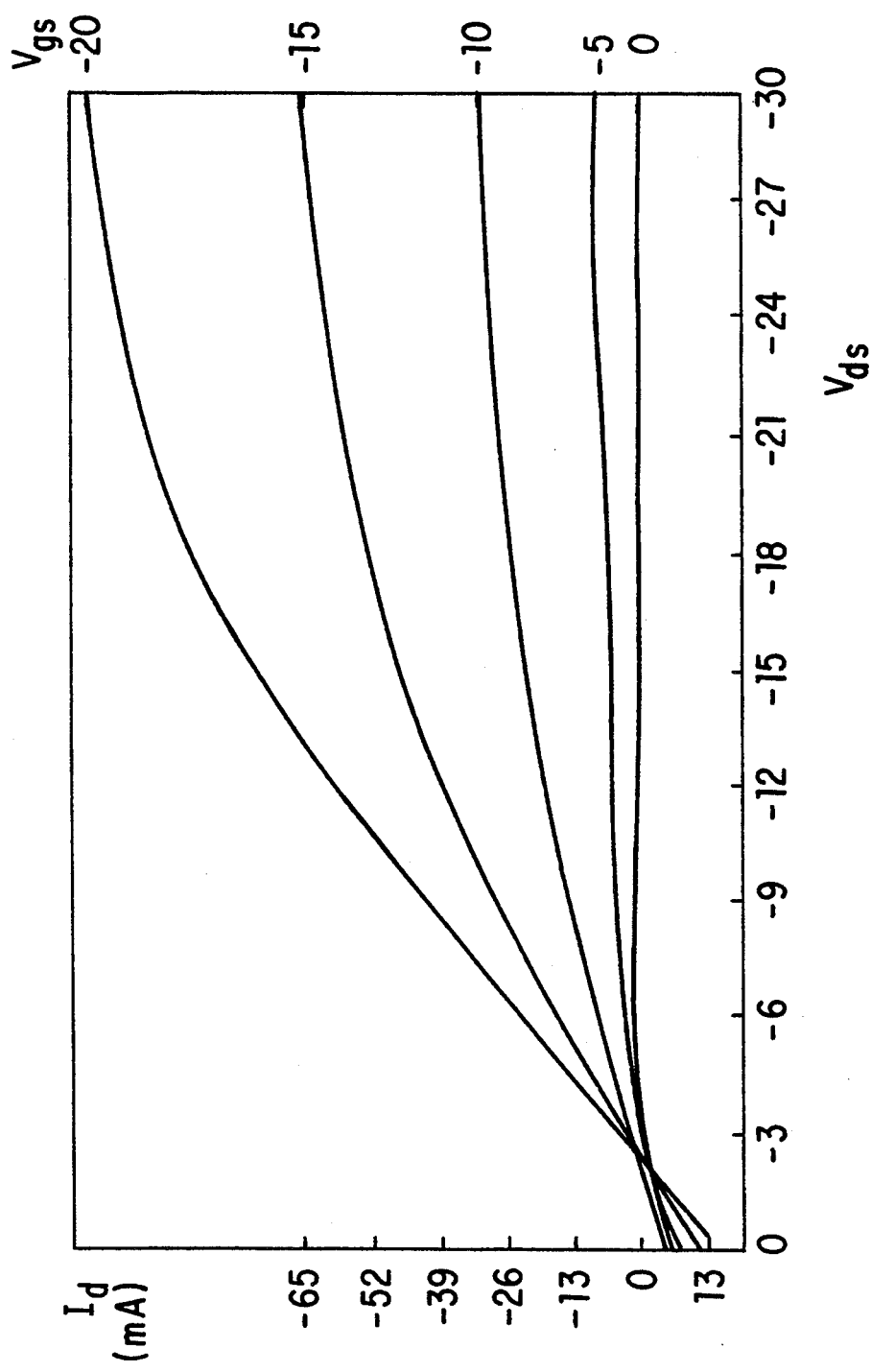
FIG 1. shows amplification characteristics of transistors of the invention.

As stated in the experimental part below, it has been discovered that the insulating ability is not the sole criterion of choice of the insulating material, and the dielectric constant of the insulator must also be taken into consideration. Preferably an insulating material with a dielectric constant of at least 6 is used. The choice of such an insulating material affects the structure of the junction layer of the semiconductor, that translates into improved quality of the carriers. For this reason, the invention must be deemed to relate to the combination of a nonpolymer organic semiconductor and a polymer insulator with a sufficiently high dielectric constant.

Polyvinyl alcohol, preferably deposited in the crystalline form, is as a particularly useful insulating polymer. Particularly good results are obtained with a thin insulating layer composed of cyanoethylpullulane. It will be recalled that cyanoethylpullulane is a polysaccharide derivative obtained by reacting pullulane and acrylonitrile in the presence of an alkaline catalyst. Cyanoethylpullulane has good solubility in various organic solvents, and has good adhesive properties on substrates such as metals or glass. Cyanoethylpullulane, the preparation of which is described in U.S. Pat. No. 4,322,524, is marketed by Shin-Etsu Chemical Co., Ltd., Tokyo (Japan).

The use, as semiconductors, of specific chemical compounds has various advantages (particularly reproducibility) over the use of polymers, which are in fact mixtures of macromolecules with different sizes. Such specific chemical compounds are easier to work with than polymers: it is generally easier to dissolve them and it is also possible to evaporate or sublimate them. In addition, preparation of high-molecular-weight polymers leads to macromolecules with defects whose number increases with chain length and which result in particular in reduced mobility of the charge carriers.

In order for the semiconductor to have sufficient carrier mobility under the field effect, it is appropriate for it to have at least 8 and preferably at least 10 conjugated bonds (double bonds and possibly triple bonds).

Preferably, a semiconductor whose carrier mobility under the field effect is at least equal to $10^{-3} cm^2 V^{-1} s^{-1}$ and preferably at least $10^{-1} cm^2 V^{-1} s^{-1}$ will be chosen.

Of the polyconjugated organic compounds that can be used, compounds chosen from the following will be cited in particular as representative of preferred examples:

conjugated oligomers whose units include or are constituted by phenylene groups that may be substituted, ortho-fused or ortho- and peri-fused aromatic polycyclic hydrocarbons having 4 to 20 fused rings, polyenes with the formula $$H-C(T_1)=C(T_2)_r-H$$

wherein $T_1$ and $T_2$ represent independently —H or a lower alkyl and r is a whole number which may range from 8 to 50, conjugated oligomers whose repeating units contain at least one five-link heterocycle.

Of the conjugated oligomers containing phenylene groups, those with formula I will be cited in particular:

(I)

wherein $R''_1$, $R''_2$, and $Z_1$ each independently represent —H, Cl, F, a trifluoromethyl group, or a nitro group, Y' represents —C(T$_1$)=C(T$_2$)—
—C≡C—
—N(R')—
—N=N—
—(R')=N—
—N=C(R')—, $T_1$ and $T_2$ independently represent —H or a lower alkyl, R' represents —H, alkyl, substituted alkyl, aryl, or substituted aryl, n' is a number equal to zero or 1, n" is a number equal to zero or 1, and n is a whole number that may range between 3 and 12.

Of the oligomers in formula I, those for which $Z_1$=H will be cited in particular. When the $Z_1$ group is different from —H, it may be present in the starting product or introduced according to known methods after the oligomerization reaction.

Among the oligomers containing phenylene units, oligomers of the peri-polyphenyl type which can be prepared for example according to the method described by Kovacic and Koch, J. Org. Chem., Vol. 28, pp. 1864–1867 (1963) may be mentioned in particular.

Of the fused aromatic polycyclic hydrocarbons, ortho-fused or ortho- and peri-fused polycyclic compounds with formula II will be cited in particular as representative of preferred examples:

(II)

namely corresponding to the molecular formula:

$$C_{4t+10}H_{2t+8}$$

t being a whole number which can range from 2 to 15.

Of these compounds, which are known compounds, polyacenes may be cited in particular.

Polymers with a specific number of units can be obtained from the conjugated oligomers containing five-link heterocycles; those corresponding to formula III will be cited in particular as representative of preferred examples:

(III)

A UNITS          A' UNITS wherein:

X and X' independently represent O, S, Se, Te, or —N(R)—,

R represents H, alkyl, substituted alkyl, aryl, or substituted aryl;

$R_1$, $R_2$, $R'_1$, $R'_2$, $R'_3$, and $R''_3$ each independently represent —H, Cl, F, or a —CF$_3$, —NO$_2$, —CN, —COOR$_3$ group, —N(R$_4$)(R$_5$), alkyl, substituted alkyl, aryl, substituted aryl, alkoxy or polyalkoxy, $R_3$ represents an alkyl or substituted alkyl group or a metal, $R_4$ represents H or an alkyl or substituted alkyl group, $R_5$ represents an alkyl, acyl, or aryl group or $R_1$ and $R_2$ and/or $R'_1$ and $R'_2$ pairs together represent a divalent hydrocarbon group which may be unsaturated or possibly interrupted and/or terminated by at least one heteroatom, Y, Y$_1$, Y$_2$, and Y$_3$ independently represent the following groups:

—C(R')=C(R")—
—C≡C—
—N(R')—
—N=N—
—C(R')=N—
—N=C(R')—,

R' and R" independently represent —H, alkyl, substituted alkyl, aryl, or substituted aryl, a, b, a', b' are numbers equal to 0 or 1, or $Y_1$ may also represent a cyclic or heterocyclic arylene group, and in this case b=1 and a'=0, s and t are whole numbers, including zero, of which at least one is different from zero, m' is a whole number equal to at least 1, the numbers s, t, and m' are such that m' (s+t)=m, m being a whole number between 4 and 24.

In the oligomer with formula III, units A and A' can alternate regularly or not. In addition, in a given oligomer, the substituents and/or heteroatoms of the units can be different.

The heterocyclic oligomers with formula III can be prepared from the corresponding monomers, or lower-ranked oligomers, by oxidative coupling reactions, according to a method described in French Patent Application No. 8907610, filed on behalf of the Centre National de la Recherche Scientifique (C.N.R.S.) on Jun. 8, 1989, entitled "Process for Preparing Oligomers of Aromatic Heterocycles By Oxidative Coupling of Lower Oligomers," and in European Patent Application No. 90.401576 parallel thereto filed on Jun. 8, 1990. This process is comprised of subjecting the starting product, dissolved in a non-water-miscible organic solvent, to an oxidative coupling reaction, at a lower oxidation potential than that of a polymerization reaction, to obtain a corresponding oligomer, having at least double the number of repeating units as that of the starting product. The oxidative coupling reaction may be accomplished in particular with the aid of a Lewis acid or a Bronsted acid. Of the Lewis acids, $FeCl_3$, $MoCl_5$, $CuCl_2$ and $RuCl_3$ may be cited. Of the Bronsted acids, oxidative mineral acids such as $H_2SO_4$, $HNO_3$, and $HClO_4$ may be cited. The oxidative coupling reaction may also be effected by anodic oxidation in an electrosynthesis cell, operating in an organic solvent containing the starting oligomer and an electrolyte; for example, an inert electrode, immersed in the organic solvent containing the starting oligomer and an electrolyte, is subjected under agitation to an anodic potential just sufficient to effect the coupling without proceeding to the point of polymerization, and particularly in the case where the higher-ranked oligomer formed is insoluble in the medium, one operates at the lowest potential for which precipitation is observed. The organic solvent may be chosen from among benzene, chloro-benzene, chloronaphthalene, methylene chloride, chloroform, and benzonitrile.

Of the oligomers with formula III, those cited in particular as preferred examples are those for which $R'_3$ and/or $R''_3$ represent —H. The $R'_3$ and/or $R''_3$ groups which are different from —H may be present on the starting monomer before oligomerization, or can be introduced by known methods after oligomerization.

The starting oligomers may be prepared by known methods from the corresponding monomers and/or lower oligomers. For example in the case of thiophene derivatives, one may operate according to the methods described by J. Kagan et al., J. Org. Chem., 48, 4317, 1983; J. Kagan et al., Heterocycles, Vol. 20, No. 10, 1937–1940, 1983; J. Kagan et al., Tetrahedron Letters, Vol. 24, No. 38, 4043–4046, 1983; J. Nakayama et al., Heterocycles, Vol. 26, No. 4, 937 (1987) and Vol. 27, No. 7, 1731–1754, 1988; K. Tamao et al., Tetrahedron, 38(22), 3347, 1982; S. Tasaka et al., Synth. Met., 16, 17, 1986; T. Kauffmann et al., Angew. Chem. Internat. Edit., Vol. 10, No. 10, 741 (1971); B. Krische et al., J. Chem. Soc., Chem. Commun., 1476 (1987); D. D. Cunningham et al., J. Chem. Soc., Chem. Commun., 1021 (1987); R. Shabana et al., Phosphorus, Sulfur and Silicon, Vol. 48, 239–244 (1990); A. Pelter et al., Tetrahedron Letters, 30, 3461 (1989). The starting monomers are themselves known or can be prepared according to known methods; see for example European Patent Applications 240,063 and 257,573, U.S. Pat. No. 4,731,408, French Patent Application 2,527,844, and M. Kobayashi et al., J. Chem. Phys., 82, 12, 5717–5723, 1985.

The transistor of the invention can in general be prepared by using known techniques. On the chosen substrate, which may be for example a glass or thermoplastic polymer substrate, the metal layer of which the grid is constituted is deposited for example by cathode sputtering or by evaporation. The metal grid can also be constituted by a highly doped semiconductor or by an organic conductor, for example a conducting polymer. The insulating layer may then be applied in the form of an insulating polymer solution in an organic solvent, after which the solvent is evaporated or allowed to evaporate. The insulating layer can also be deposited by evaporation or by a technique known as spin-coating. The semiconductor layer may then be deposited either by evaporation or in the form of a solution in an organic solvent, this deposition being followed by evaporation of the solvent. Before depositing the semiconductor, it is also possible to modify the insulator surface in known fashion by mechanical treatment (such as brushing) or electrical treatment (corona discharge for example) in order to orient the semiconductor molecules at the insulator-semiconductor interface. Finally, by evaporation for example, the metal electrodes constituting the source and the drain are deposited. As an alternative, the electrodes constituting the source and the drain can be applied directly to the insulating layer, after which the semiconductor layer is applied. The geometry of the transistor may be any geometry compatible with utilization of the field-effect transistor.

In general, the insulating layer has a thickness of between 0.5 $\mu$ and 10 $\mu$, preferably between 1 and 3 $\mu$. One of the advantages of the use of a polymer is that it is possible easily to obtain relatively thick layers, which decreases the risk of breakdown.

The semiconductor is deposited in the form of a layer between 20 and 200 nm for example thick. In general, the semiconductor is deposited in a neutral (nonionic) form without added dopant. However, if desired, a dopant can be added according to the usual techniques.

The transistors of the invention can be used in all applications of thin-layer field-effect transistors, for switching, and for amplification. This utilization is part of the invention.

The following examples illustrate the invention without however limiting it.

EXAMPLE 1

The substrate used is a glass plate measuring 1 cm×2.5 cm. A strip of gold is deposited by sputtering to form the grid. The insulating polymer is deposited in the form of a solution (1 ml of solution deposited with the aid of a Hamilton syringe), after which the solvent is allowed to evaporate.

The solvents and concentrations of polymers used are shown in Table 1 below:

| POLYMER | SOLVENT | CONCENTRATION (g/l) |
|---|---|---|
| CYEPL | DMF:CH$_3$CN 1:1 (Vol.) | 30-60 |
| PVA | H$_2$O | 5 |
| PVC | DMF:CHCl$_3$ | 10 |
| PMMA | CHCl$_3$ | 6 |
| PSt | CHCl$_3$ | 6 |

CYPEL: Cyanoethylpullulane
PVA: Polyvinyl alcohol (Aldrich Chemie)
PVC: Polyvinyl chloride (Aldrich Chemie)
PMMA: Polymethylmethacrylate (Aldrich Chemie)
Pst: Polystyrene (Aldrich Chemie)

The thickness of the insulating level is checked by measuring its capacitance at 10 kHz between the grid electrode and a gold electrode deposited by evaporation on the insulating layer. A layer of alpha-sexithienyl is deposited by vacuum evaporation at a pressure of $5 \times 10^{-3}$ Pa. The thickness of the semiconductor layer is checked with a quartz microbalance assuming a density of 1.38 g/cm$^3$ for the alpha-sexithienyl. The thin-layer transistor is completed by evaporation deposition of two gold electrodes 25 nm thick separated from each other by a space of 90 μ, these electrodes constituting the source and the drain.

All the electrical measurements are conducted in air at room temperature, using tungsten microsondes for the electrical contacts. The current-voltage characteristics are obtained with a Hewlett Packard 4140B pico-ammeter/voltage source. The capacitance is measured with an HP 4192A impedance analyzer. The two units are controlled by an HP 310 microcomputer.

The results are summarized in Table II below.

| INSULATOR | ∈r Dielectric Constant (at 10 kHz) | MOBILITY UNDER FIELD EFFECT (cm$^2$V$^{-1}$s$^{-1}$) | VOLTAGE (THRESHOLD) (V) | CAPACITANCE (nF/cm$^2$) |
|---|---|---|---|---|
| SiO$_2$ | 3.9 | $2.1 \times 10^{-4}$ | −0.0 | 15 |
| CYEPL | 18.5 | $3.4 \times 10^{-2}$ | −3.4 | 6 |
| PVA | 7.8 | $9.3 \times 10^{-4}$ | −0.8 | 10 |
| PVC | 4.6 | a | a | — |
| PMMA | 3.5 | b | b | — |
| PSt | 2.6 | b | b | — | a) Not measurable because field effect too small.
b) No field effect.

An example of the amplification characteristic is given in FIG. 1 attached in which the source-drain voltage V$_{ds}$ is shown on the horizontal axis and the intensity of the drain current (I$_d$) obtained at different source-grid voltage values V$_{gs}$ (shown on the right part of the figure) is on the vertical axis.

It should be noted that the differences in mobility under the field effect observed with the different solvents studied cannot be attributed to differences in electrical capacitance of the system since all the devices tested have a similar capacitance, on the order of 10 nF/cm$^2$. The good insulating ability of the thin layer between the grid and the semiconductor is thus not the only criterion to be taken into consideration, and it has been discovered that the insulator must also have a sufficiently high dielectric constant. Although these considerations do not bind the inventors and can in no event be used to interpret the subject of the present application limitatively, it is assumed that the effect of improving mobility is due to an improved structural organization of the semiconductor deposited on the insulating substrate which is a polar insulator since it is known that the more the insulator molecule is polar, the higher is its dielectric constant. This change in semiconductor structure in the vicinity of the insulator results in increased mobility of the carriers.

EXAMPLE 2

Operating analogously to the manner described in Example 1 but using an alpha-sexithienyl purified by successive extractions in the Soxhlet by dichloromethane, the following results summarized in Table III below are obtained.

The gold electrodes (source and drain) are separated here by a space of 50 μ.

TABLE III

| INSULATOR | MOBILITY UNDER FIELD EFFECT (cm$^2$V$^{-1}$s$^{-1}$) | THRESHOLD VOLTAGE (V) |
|---|---|---|
| CYEPL | $4 \times 10^{-1}$ | −0.8 |
| PVA | $1 \times 10^{-3}$ | −0.8 |
| PVC | $2 \times 10^{-5}$ | −1.0 |

We claim:

1. A thin-layer field-effect transistor (TFT) with an MIS structure comprising a thin semiconductor layer between a source and a drain, said thin semiconductor layer being in contact with one surface of a thin layer made of insulating material, and said thin insulating layer being in contact by its other surface with a conducting grid, wherein said semiconductor is composed of at least one polyconjugated organic compound which contains at least 8 conjugated bonds and has a molecular weight of no greater than approximately 2,000, and wherein said thin layer of insulating material comprises an insulating organic polymer having a dielectric constant at least equal to 5.

2. A transistor according to claim 1, wherein said insulating polymer has a dielectric constant of at least 6.

3. A transistor according to claim 1, wherein said insulating polymer is polyvinyl alcohol.

4. A transistor according to claim 1, wherein said insulating polymer is cyanoethylpullulane.

5. A transistor according to claim 1, wherein said polyconjugated organic compound has at least 10 conjugated bonds.

6. A transistor according to claim 1, wherein said polyconjugated organic compound contains a sufficient number of conjugated bonds for its mobility under a field effect to be at least equal to $10^{-3}$cm$^2$V$^{-1}$s$^{-1}$.

7. A transistor according to claim 1, wherein said polyconjugated organic compound is at least one member selected from the of:

conjugated oligomers whose units include or are constituted by phenylene groups that may be substituted, ortho-fused or ortho- and peri-fused aromatic polycyclic hydrocarbons having 4 to 20 fused rings, polyenes with the formula $$H-C(T_1)=C(T_2)_r-H$$

wherein $T_1$ and $T_2$ independently represent —H or a lower alkyl and r is a whole number which may range from 8 to 50, and conjugated oligomers whose repeating units contain at least one five-link heterocycle.

8. A transistor according to claim 7, wherein said oligomers containing phenylene units are represented by formula I:

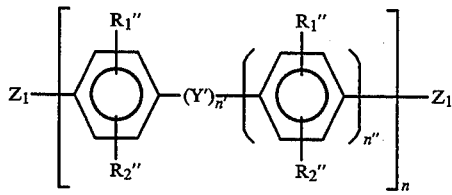

wherein $R''_1$, $R''_2$, and $Z_1$ each independently represent —H, Cl, F or a trifluoromethyl group or a nitro group,
Y' represents —C($T_1$)=C($T_2$)—
—C≡C—
—N(R')—
—N=N—
—C(R')=N—
—N=C(R')—, $T_1$ and $T_2$ independently represent —H or a lower alkyl,
R' represents —H, alkyl, substituted alkyl, aryl, or substituted aryl,
n' is a number equal to zero or 1,
n' is a number equal to zero or 1, and
n is a whole number that may range between 3 and 12.

9. A transistor according to the claim 8, wherein $Z_1$ represents —H.

10. A transistor according to claim 7, wherein said aromatic polycyclic compound is an ortho-fused or ortho- and peri-fused polycyclic compound represented by formula II:

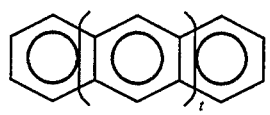

corresponding to the molecular formula:

$$C_{4t+10}H_{2t+8}$$

t being a whole number which can range from 2 to 15.

11. A transistor according to claim 8, wherein said aromatic heterocycle oligomer is an oligomer with formula:

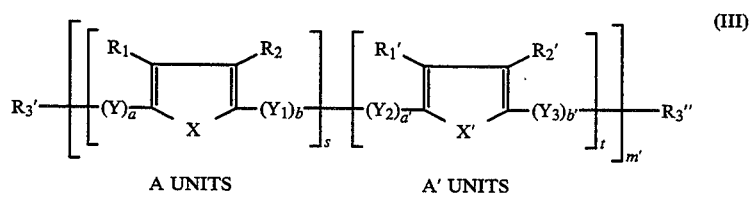

wherein:

X and X' represent independently O, S, Se, Te, or —N(R)—,

R represents H, alkyl, substituted alkyl, aryl, or substituted aryl;

$R_1$, $R_2$, $R'_1$, $R'_2$, $R'_3$, and $R''_3$ each independently represent —H, Cl, F, —CF$_3$, —NO$_2$, —CN, —COOR$_3$, —N(R$_4$) (R$_5$), alkyl, substituted alkyl, aryl, substituted aryl, alkoxy or polyalkoxy, $R_3$ represents an alkyl or substituted alkyl group or a metal, $R_4$ represents H or an alkyl or substituted alkyl group, $R_5$ represents an alkyl, acyl, or aryl group, or at least one of the pairs $R_1$ and $R_2$ and $R'_1$ and $R'_2$ together represent a divalent hydrocarbon group which may be unsaturated, interrupted, terminated or a combination thereof by at least one heteroatom, Y, $Y_1$, $Y_2$, and $Y_3$ independently represent the following groups:
—C(R')=C(R'')—
—C≡C—
—N(R')—
—N=N—
—C(R')=N——N=C(R')—, R' and R'' independently represent —H, alkyl, substituted alkyl, aryl, or substituted aryl, a, b, a', b' are numbers equal to 0 or 1, or $Y_1$ may also represent a cyclic or heterocyclic arylene group, and in this case b=1 and a'=0, s and t are whole numbers, including zero, of which at least one is different from zero, m' is a whole number equal to at least 1, the numbers s, t, and m' are such that m' (s+t)=m, m being a whole number between 4 and 24.

12. A transistor according to claim 11, wherein at least one of $R'_3$ and $R''_3$ represents —H.

13. A switching or amplification element comprising a transistor as defined in claim 1.

14. A transistor according to claim 6, wherein said mobility is at least $10^{-1}$ cm$^2$V$^{-1}$s$^{-1}$.

* * * * *